(12) United States Patent
Müller

(10) Patent No.: US 10,212,802 B2
(45) Date of Patent: Feb. 19, 2019

(54) ELECTRONIC DEVICE AND METHOD FOR PRODUCING AN ELECTRONIC DEVICE

(71) Applicant: Schweizer Electronic AG, Schramberg (DE)

(72) Inventor: Robert Müller, Dunningen (DE)

(73) Assignee: Schweizer Electronic AG, Schramberg (DE)

(*) Notice: Subject to any disclaimer, the term of this patent is extended or adjusted under 35 U.S.C. 154(b) by 0 days.

(21) Appl. No.: 15/634,770

(22) Filed: Jun. 27, 2017

(65) Prior Publication Data

US 2018/0007779 A1 Jan. 4, 2018

(30) Foreign Application Priority Data

Jun. 30, 2016 (DE) .................. 10 2016 211 967

(51) Int. Cl.
*H05K 1/02* (2006.01)
*H01L 23/473* (2006.01)
(Continued)

(52) U.S. Cl.
CPC ......... *H05K 1/0203* (2013.01); *H01L 23/473* (2013.01); *H05K 1/02* (2013.01);
(Continued)

(58) Field of Classification Search
CPC ......... H01L 23/473; H01L 2224/48091; H01L 2924/12044; H01L 2224/73265;
(Continued)

(56) References Cited

U.S. PATENT DOCUMENTS 4,888,663 A * 12/1989 Longerich .............. G02B 6/001
165/80.4
4,903,603 A * 2/1990 Longerich .............. G02B 6/001
102/293
(Continued)

FOREIGN PATENT DOCUMENTS

DE 40 12 100 10/1991
DE 10 2005 040453 4/2006
(Continued)

OTHER PUBLICATIONS

Office Action in the priority application DE 10 2016 211 967.2, dated Jan. 27, 2017.

*Primary Examiner* — Adam B Dravininkas
(74) *Attorney, Agent, or Firm* — Shlesinger, Arkwright & Garvey LLP

(57) ABSTRACT

The invention relates to an electronic device comprising a printed circuit board (14) and comprising an electronic component (16) arranged on a first surface (15) of the printed circuit board (14). The printed circuit board (14) has a cutout (23) extending from a second surface (24) of the printed circuit board (14), said second surface being situated opposite the first surface (15), in the direction of the electronic component (16). The electronic device comprises a coolant container (25), which has an opening closed by the second surface (24) of the printed circuit board (14). The invention additionally relates to a method for producing such an electronic device.

15 Claims, 1 Drawing Sheet

(51) Int. Cl.
*H05K 3/22* (2006.01)
*H05K 1/18* (2006.01)

(52) U.S. Cl.
CPC .............. *H05K 1/181* (2013.01); *H05K 3/22* (2013.01); *H05K 2201/0338* (2013.01); *H05K 2201/064* (2013.01); *H05K 2201/09036* (2013.01)

(58) Field of Classification Search
CPC . H01L 2224/32225; H01L 2924/13055; H01L 2924/1305; H01L 2224/48227; H01L 2924/181; H05K 7/20254; H05K 7/20927; H05K 7/20809; H05K 7/20327; H05K 1/0203; H05K 7/20781; H05K 7/20763; H05K 1/0209; H05K 1/092
See application file for complete search history.

(56) References Cited

U.S. PATENT DOCUMENTS

| | | | | |
|---|---|---|---|---|
| 5,325,265 A * | 6/1994 | Turlik | .................. | H01L 23/3736 257/714 |
| 5,812,375 A * | 9/1998 | Casperson | ........... | H05K 1/0204 165/80.3 |
| 6,594,149 B2 * | 7/2003 | Yamada | ............. | H05K 7/20872 165/170 |
| 6,992,887 B2 * | 1/2006 | Jairazbhoy | ............ | H01L 23/473 165/80.4 |
| 2003/0053294 A1 * | 3/2003 | Yamada | ............. | H05K 7/20872 361/699 |
| 2006/0067373 A1 * | 3/2006 | Alander | .............. | H01S 5/02248 372/34 |
| 2007/0297145 A1 * | 12/2007 | Karrer | ................. | H01L 23/3735 361/720 |
| 2010/0155932 A1 * | 6/2010 | Gambino | ............ | G06F 17/5068 257/698 |
| 2013/0008703 A1 * | 1/2013 | Stahr | .................... | H05K 3/4697 174/260 |
| 2015/0237733 A1 * | 8/2015 | Stahr | ..................... | H05K 1/185 361/761 |

FOREIGN PATENT DOCUMENTS

| | | |
|---|---|---|
| DE | 10 2004 062 441 | 7/2006 |
| DE | 10 2004 062441 | 7/2006 |
| DE | 10 2005 034546 | 1/2007 |
| DE | 10 2006 028675 | 12/2007 |
| DE | 10 2008 059452 | 6/2010 |
| DE | 20 2010 017 772 | 10/2012 |
| DE | 20 2010 017 772 | 12/2012 |
| DE | 10 2011 088970 | 6/2013 |

\* cited by examiner

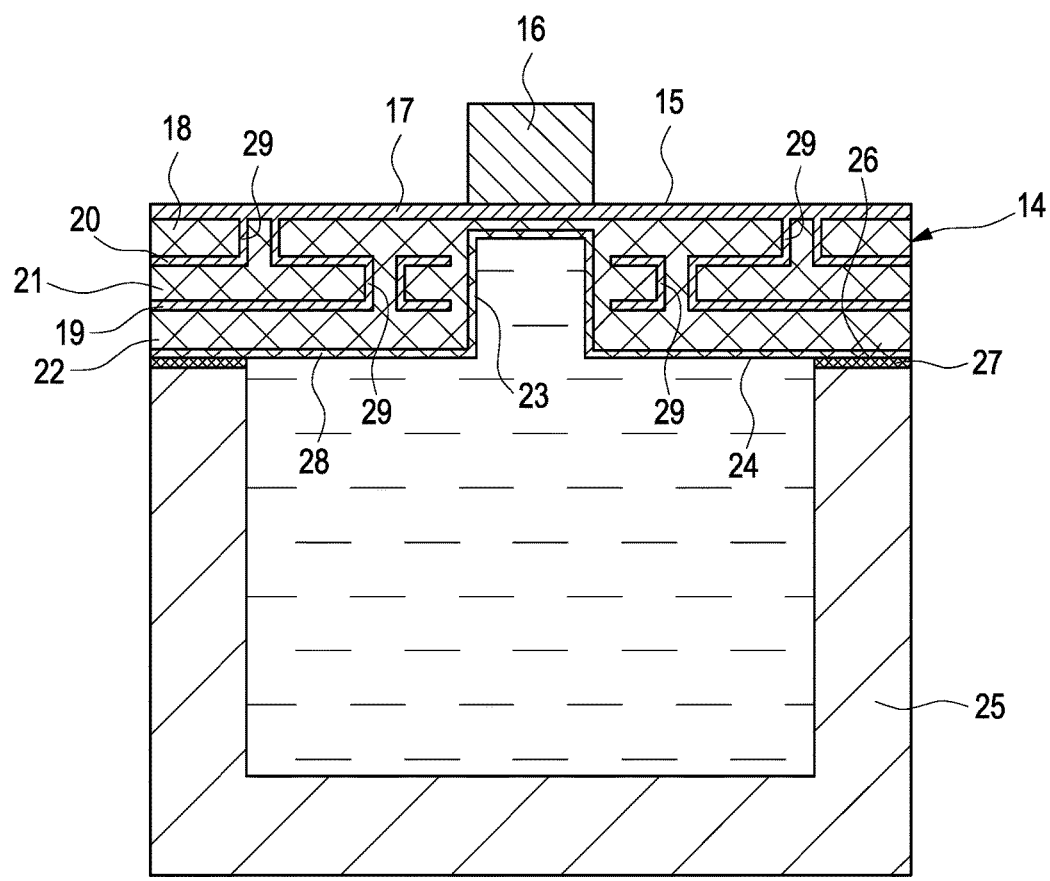

ELECTRONIC DEVICE AND METHOD FOR PRODUCING AN ELECTRONIC DEVICE

FIELD OF THE INVENTION

The invention relates to an electronic device having an electronic component arranged on a first surface of a printed circuit board. The invention additionally relates to a method for producing such an electronic device.

BACKGROUND OF THE INVENTION

During the operation of such electronic devices heat is generated. This holds true, in particular, if the component is operated with high power, as is the case for a power semiconductor, for example. Printed circuit boards are known which have cooling channels extending in their interior, with a cooling liquid flowing through said cooling channels during the operation of the printed circuit board, DE 10 2004 062 441 B3, DE 20 2010 017 772 U1. The production of such cooling channels in the interior of the printed circuit board involves a high outlay.

SUMMARY OF THE INVENTION

The invention is based on the object of presenting a printed circuit board and a method for producing such a printed circuit board in which the outlay is reduced.

Departing from the cited prior art, the object is achieved by means of the features of the invention as disclosed herein. Advantageous embodiments are specified herein.

The invention proposes an electronic device which comprises a printed circuit board and an electronic component arranged on a first surface of the printed circuit board. The printed circuit board has a cutout or recess extending from a second surface of the printed circuit board, said second surface being situated opposite the first surface, in the direction of the electronic component. The electronic device additionally comprises a coolant container. The coolant container has an opening closed by the second surface of the printed circuit board.

The component can be an active or passive electronic component. In particular, the component can be a semiconductor component, for example in the form of a power semiconductor. A shunt, for example, is appropriate as a passive electronic component.

By virtue of the coolant container having an opening aligned in the direction of the printed circuit board, a cooling liquid contained in the coolant container can make direct contact with the printed circuit board and thereby effectively dissipate heat from the printed circuit board. The material thickness of the printed circuit board is reduced in the region of the cutout or recess, such that heat emitted by the electronic component can readily be transferred into the cooling liquid, without the heat spreading over a large area in the printed circuit board.

In order to ensure a good heat transfer from the electronic component to the cooling liquid, the material thickness in the region of the cutout can be significantly less than the thickness of the printed circuit board. By way of example, the material thickness can be less than 50%, preferably less than 30%, more preferably less than 20%, of the thickness of the printed circuit board.

The cutout or recess can have side faces aligned perpendicularly to the plane of the printed circuit board. The side faces can extend as far as an end face that is parallel to the plane of the printed circuit board. The two sides of the printed circuit board are separated from one another by the end face. The cutout does not form a perforation of the printed circuit board. According to one embodiment, the cutout is cuboid. Embodiments in which the side faces of the cutout form an angle with the plane of the printed circuit board that is different than 90° are also encompassed.

The cutout can be dimensioned such that it overlaps the electronic component in the Z-direction. The Z-direction is aligned perpendicularly to the plane of the printed circuit board. In other words, if the cutout is of at least the same size or larger than the electronic component, then an effective heat transfer from the electronic component in the direction of the cooling liquid is possible.

The opening of the coolant container can be larger than the cutout in the printed circuit board. The opening can be larger than the cutout for example by the factor 2, preferably by the factor 5, more preferably by the factor 10. The coolant container can be arranged such that the cutout lies completely within the opening. The extent of the coolant container in the Z-direction can be greater than the extent of the cutout in the Z-direction. By way of example, the coolant container, relative to the Z-direction, can be larger than the cutout by the factor 1.2, preferably by the factor 2, more preferably by the factor 3.

An end face of the coolant container that surrounds the opening can be connected to the second surface of the printed circuit board. A sealant can be arranged between the end face of the coolant container and the surface of the printed circuit board, such that the coolant is prevented from emerging at the connection point. By way of example, a screw connection can be provided for the mechanical securing of the coolant container on the printed circuit board.

The coolant container can have an inlet opening and an outlet opening, such that it is possible to generate a coolant flow through the coolant container. The coolant container can be connected to a cooling system comprising a heat exchanger. Pipelines can extend between the outlet opening of the coolant container and the heat exchanger and also between the heat exchanger and the inlet opening of the coolant container, such that a coolant circuit can be initiated.

The first surface of the printed circuit board can be covered at least regionally with an electrically conductive layer. The electronic component can be electrically contacted with the conductive layer.

An electrically insulating layer can be arranged between the cutout and the electronic component. An electrical contact between the coolant and the electronic component is thus prevented. In order to achieve a good heat flow between the electronic component and the cooling liquid, the electrically insulating layer can have a good thermal conductivity.

The invention also encompasses embodiments in which there is an electrical contact between the coolant and the electronic component. This is possible, in particular, if the connection contact of the electronic component that is electrically in contact with the coolant is grounded.

A surface region of the printed circuit board that is arranged within the opening of the coolant container can be in direct contact with the coolant. The surface region can comprise, in particular, the areas of the printed circuit board which adjoin the cutout. Said surface region can be electrically insulated from the electronic component.

The electrically insulating material used for printed circuit boards often does not have good resistance to liquids. In order to protect the electrically insulating material from the cooling liquid, the surface region of the printed circuit board that is in contact with the coolant can be covered with a diffusion-impermeable protective layer. The protective layer can be a corrosion-resistant metallic coating, in particular a coating composed of Cu, Ni or Au or a layer sequence composed of these materials. The printed circuit board can thus withstand even aggressive coolants, such as, for example, glycol or an aqueous glycol solution. The space enclosed between the coolant container and the printed circuit board can be completely filled with the coolant.

The printed circuit board can be a multilayer printed circuit board. This means that the printed circuit board comprises regions in which a plurality of conductive layers and non-conductive layers succeed one another alternately in the Z-direction. There may be plated-through holes between the conductive layers, such that there are electrical connections between conductive layers in the Z-direction.

Each of the electrically conductive layers can be electrically insulated from the coolant. In particular, a protective layer applied on the second surface of the printed circuit board can be electrically insulated from the electrically conductive layers.

It is also possible for thermal vias to be formed between the layers. A thermal via denotes a metallic contact between two conductive layers which, in the relevant application, is not used for transmitting electric currents, but rather serves to reduce the thermal contact resistance between the electronic component and the coolant.

The invention additionally relates to a method for producing an electronic device. In the method, a cutout or recess is produced in a printed circuit board, said cutout extending from a second surface in the direction of a first surface situated opposite the second surface, without perforating the printed circuit board. A coolant container having an opening is thus connected to the second surface of the printed circuit board such that the opening is closed by the printed circuit board. A cooling liquid is filled into the coolant container.

In a region of the first surface situated opposite the cutout, an electronic component to be cooled can be connected to the printed circuit board. The electronic component to be cooled can be for example an active component or a passive component.

If, when producing the cutout, electrically conductive layers of the printed circuit board are cut, then an electrically insulating layer can be applied within the cutout, which electrically insulates the surface of the cutout from the electrically conductive layers. A diffusion-impermeable protective layer can be applied on the second surface of the printed circuit board and covers at least that surface region of the printed circuit board which comes into contact with the coolant.

The method can be developed with further features described in association with the electronic device according to the invention. The electronic device can be developed with further features described in association with the method according to the invention.

BRIEF DESCRIPTION OF THE INVENTION

The invention is described by way of example below on the basis of an advantageous embodiment with reference to the accompanying drawing, in which:

FIG. 1: shows a schematic sectional illustration of an electronic device according to the invention.

DETAILED DESCRIPTION OF THE INVENTION

An electronic device shown in FIG. 1 comprises a printed circuit board 14 with a semiconductor component 16 arranged on its top side 15 (first surface). The semiconductor component 16 is a power semiconductor in the form of a MOSFET, during the operation of which a considerable amount of heat is emitted. The semiconductor component 16 is electrically contacted with an electrically conductive layer 17 that partly covers the top side of the printed circuit board 14.

The electrically conductive layer 17 is applied on a layer 18 of the printed circuit board 14 which is electrically insulating, but may have a good thermal conductivity. The printed circuit board 14 is constructed in a multilayer fashion, which means that further electrically conductive layers 19, 20 alternating with insulating layers 21, 22 succeed one another below the electrically insulating layer 18. Between the electrically conductive layers 17, 19, 20 there are plated-through holes 29 that establish an electrical contact between different layers in the Z-direction.

A cutout or recess 23 is formed in the printed circuit board 14, which cutout is rectangular in cross section and extends from the underside 24 (second surface) of the printed circuit board 14 in the direction of the semiconductor component 16. The cutout 23 is dimensioned such that its extent in the X-Y-direction substantially corresponds to the semiconductor component 16. The cutout 23 is arranged such that it overlaps the semiconductor component 16 in the Z-direction.

A coolant container 25 is connected to the underside 24 of the printed circuit board 14, said coolant container being open at its upper end. The coolant container 25 is connected to the underside 24 of the printed circuit board 14 via an end face 26, such that a closed-off space is formed which is enclosed between the coolant container 25 and the printed circuit board 14. The cutout 23 of the printed circuit board 14 is part of this closed-off space. A sealing material 27 is applied between the end face 26 of the coolant container 25 and the printed circuit board 14, such that no coolant can emerge even at the connection point.

The coolant container 25 is provided with an inlet opening and an outlet opening (not illustrated), via which the coolant container 25 is connected to a cooling system. In the cooling system, the coolant is guided in a closed circuit extending between the coolant container 25 and a heat exchanger. In the heat exchanger, heat is emitted to the surroundings.

The underside of the printed circuit board 14 is covered with a protective layer 28 in the form of a Cu—Ni/Cu—Ni—Au coating, such that there is no contact between the coolant and the electrically insulating layers of the printed circuit board. The protective layer 28 is electrically insulated from the electrically conductive layers 17, 19, 20.

In the configuration according to the invention, the semiconductor component 16 is separated from the coolant merely by the electrically conductive layer 17, the thin insulating layer 18 and the protective layer 28. A low thermal contact resistance thus results, such that the heat can readily be transferred from the semiconductor component to the cooling liquid. With the cooling liquid, the heat is transported away in the cooling system, such that the semiconductor component 16 is effectively cooled.

The invention claimed is:

1. An electronic device comprising:
   a multilayer printed circuit board;
   an electronic component arranged on a first surface of the multilayer printed circuit board;
   the multilayer printed circuit board has a cutout extending from a second surface of the multilayer printed circuit board in a direction toward the electronic component on the first surface to provide a reduced thickness of the multilayer printed circuit below the electronic component, the second surface being situated opposite the first surface; and a coolant container including an opening closed by the second surface of the multilayer printed circuit board.

2. The electronic device as claimed in claim 1, wherein the reduced thickness of the multilayer printed circuit board in a region of the cutout is less than 50%, or less than 30%, or less than 20%, with respect to a thickness of the multilayer printed circuit board outside of the cutout.

3. The electronic device as claimed in claim 1, wherein the cutout has side faces aligned perpendicularly to a plane of the multilayer printed circuit board.

4. The electronic device as claimed in claim 1, wherein the cutout overlaps the electronic component in a direction perpendicular to a plane of the multilayer printed circuit board.

5. The electronic device as claimed in claim 1, wherein the opening of the coolant container is larger than the cutout of the multilayer printed circuit board.

6. The electronic device as claimed in claim 1, wherein the cutout is arranged completely within the opening of the coolant container.

7. The electronic device as claimed in claim 1, wherein, relative to a direction perpendicular to a plane of the multilayer printed circuit board, an extent of the coolant container is larger than an extent of the cutout.

8. The electronic device as claimed in claim 1, wherein an electrically insulating layer is arranged between the cutout and the electronic component.

9. The electronic device as claimed in claim 1, wherein a surface region of the multilayer printed circuit board within the opening of the coolant container is electrically insulated from the electronic component.

10. The electronic device as claimed in claim 1, wherein a surface region of the multilayer printed circuit board in contact with the coolant is covered with a diffusion-impermeable protective layer.

11. The electronic device as claimed in claim 10, wherein the protective layer is a coating composed of Cu, Ni or Au or a layer sequence composed of Cu, Ni and Au.

12. The electronic device as claimed in claim 1, wherein the multilayer printed circuit board comprises a plurality of electrically conductive layers, which are electrically connected to one another, and wherein all the electrically conductive layers are electrically insulated from the coolant.

13. A method for producing an electronic device, comprising the steps of:

producing a cutout in a multilayer printed circuit board, the cutout extending from a second surface of the multilayer printed circuit board in a direction toward a first surface situated opposite the second surface, without perforating the multilayer printed circuit board to provide a reduced thickness of the multilayer printed circuit board in a region of the cutout;

connecting a coolant container having an opening to the second surface of the multilayer printed circuit board in such a way that the opening is closed by the multilayer printed circuit board; and filling the coolant container with a cooling liquid.

14. The method as claimed in claim 13, wherein, when producing the cutout, an electrically conductive layer of the multilayer printed circuit board is cut, and wherein an electrically insulating layer is applied within the cutout, such that a surface of the cutout is electrically insulated from the electrically conductive layer.

15. The method as claimed in claim 13, wherein a diffusion-impermeable protective layer is applied on the second surface of the multilayer printed circuit board and covers at least a surface region of the multilayer printed circuit board which comes into contact with the coolant.

* * * * *